United States Patent [19]

Fujii

[11] Patent Number: 5,059,833

[45] Date of Patent: Oct. 22, 1991

[54] PHASE DETECTOR SUITABLE FOR USE IN PHASE LOCK LOOP

[75] Inventor: Takashi Fujii, Tokyo, Japan

[73] Assignee: NEC Corporation, Tokyo, Japan

[21] Appl. No.: 599,196

[22] Filed: Oct. 17, 1990

[30] Foreign Application Priority Data

Oct. 17, 1989 [JP] Japan .................................. 1-270866

[51] Int. Cl.$^5$ .......................................... H03L 7/093
[52] U.S. Cl. .................................. 307/510; 307/514;
307/516; 328/262; 328/155; 328/133; 331/1 A;
331/8
[58] Field of Search ............... 307/510, 511, 514, 516;
328/262, 155, 133, 134; 331/1 A, 8

[56] References Cited

U.S. PATENT DOCUMENTS

| | | | |
|---|---|---|---|
| 4,237,423 | 12/1980 | Rhodes | 307/516 |
| 4,959,617 | 9/1990 | Martin | 307/514 |
| 4,970,472 | 11/1990 | Kennedy et al. | 331/8 |
| 4,975,650 | 12/1990 | Martin | 307/511 |
| 4,987,387 | 1/1991 | Kennedy et al. | 331/1 A |

Primary Examiner—Stanley D. Miller
Assistant Examiner—Scott A. Ouellette
Attorney, Agent, or Firm—Sughrue, Mion, Zinn, Macpeak & Seas

[57] ABSTRACT

A digital phase detector comprises a first input for receiving an output of a voltage controlled oscillator and a second input for receiving a reference signal. When a phase of the first input is in advance of that of the second input or when a frequency of the first input is higher than that of the second input, the phase detector operates to output a first control signal for decrease of an oscillation frequency of the voltage controlled oscillator. When the phase of the first input is delayed from that of the second input or when the frequency of the first input is lower than that of the second input, the phase detector operates to output a second control signal for increase of the oscillation frequency of the voltage controlled oscillator. In addition, the phase detector is configured to output neither the first control signal nor the second control signal when both of the first input and the second input are at a low level.

4 Claims, 3 Drawing Sheets

PHASE DETECTOR SUITABLE FOR USE IN PHASE LOCK LOOP

BACKGROUND OF THE INVENTION

1. Field of the invention

The present invention relates to a phase detector, and more specifically a digital phase detector suitable for use in a phase locked loop for a timing signal regeneration circuit.

2. Description of related art

Phase locked loops have been widely utilized in the field of telecommunication and electronic measurements. One recently dominant type of phase locked loop is composed of a digital phase detector and a charge pump. One typical digital phase detector has been disclosed in a Japanese book "PLL Application Circuits", page 49, published on Sept. 10, 1977 from Sogodenshishuppansha. This digital phase detector has a first input V for receiving an output of a voltage controlled oscillator and a second input R for receiving a reference signal, and operates to compare the first input V with the second input R both in phase and in frequency. When a phase of the first input V is in advance of that of the second input R or when a frequency of the first input V is higher than that of the second input R, the digital phase detector outputs a charge-down signal for decrease of an oscillation frequency of the voltage controlled oscillator. On the other hand, when the phase of the first input V is delayed from that of the second input R or when the frequency of the first input V is lower than that of the second input R, the digital phase detector outputs a charge-up signal for increase of the oscillation frequency of the voltage controlled oscillator.

In actual telecommunication, the phase locked loop is in many cases used to regenerate a timing signal from a received signal. In this case, an input signal supplied to the second input R for the reference signal is constituted of a bit train composed of "0" S and "1" S at random. Under this circumstance, there will frequently occur such a situation that the first input V and the second input R are simultaneously at a low level. In this situation, however, the conventional digital phase detector has been often encountered with a problem of outputting the charge-down signal to the charge pump although the synchronism has already been attained in phase and/or in frequency. As a result, the synchronized condition is broken. The reason for this is that when both the first and second inputs V and R of the conventional digital phase detector are "0" (zero) the conventional digital phase detector often outputs the charge-down signal.

SUMMARY OF THE INVENTION

Accordingly, it is an object of the present invention to provide a digital phase detector which has overcome the above mentioned defect of the conventional one.

Another object of the present invention is to provide a digital phase detector which outputs neither a charge-up signal nor a charge-down signal when two inputs are in synchronism with each other.

The above and other objects of the present invention are achieved in accordance with the present invention by a digital phase detector comprising a first input for receiving an output of a voltage controlled oscillator and a second input for receiving a reference signal, the phase detector operating to compare the first input with the second input both in phase and in frequency so as to output a first control signal for decrease of an oscillation frequency of the voltage controlled oscillator when a phase of the first input is in advance of that of the second input or when a frequency of the first input is higher than that of the second input, and so as to output a second control signal for increase of the oscillation frequency of the voltage controlled oscillator when the phase of the first input is delayed from that of the second input or when the frequency of the first input is lower than that of the second input. The phase detector is configured to output neither the first control signal nor the second control signal when both of the first input and the second input are at a low level.

In a preferred embodiment of the present invention, a digital phase detector comprises:

a first input for receiving an output of a voltage controlled oscillator;

a second input for receiving a reference signal;

first and second three-input NAND gates each having a first input connected to receive the output of the voltage controlled oscillator and a second input connected to receive the reference signal;

a first RS-flipflop having a set input connected to receive the output of the voltage controlled oscillator, a reset input connected to an output of the first NAND gate, and a Q output connected to a third input of the second NAND gate;

a second RS-flipflop having a set input connected to receive the reference signal, a reset input connected to an output of the second NAND gate, and a Q output connected to a thrid input of the first NAND gate;

a first logic output circuit having a first input connected to a $\overline{Q}$ output of the first flipflop, a second input connected to the Q output of the second flipflop, and an output for generating a DOWN signal for decrease of the oscillation frequency of the voltage controlled oscillator; and a second logic output circuit having a first input connected to a $\overline{Q}$ output of the seocnd flipflop, a second input connected to the Q output of the first flipflop, and an output for generating an UP signal for increase of the oscillation frequency of the voltage controlled oscillator.

As seen from the above arrangement, the digital phase detector in accordance with the present invention is characterized in that when both of a first input and a second input of the digital phase detector are at a low level, neither a control signal for increase of the oscillation frequency of the voltage controlled oscillator nor a control signal for descease of the oscillation frequency of the voltage controlled oscillator is generated. Therefore, even if a bit train of composed of "1" s and "0" s at random is given to the second input for a reference signal, the synchronism can be ensured without being broken when the first and second inputs are in synchronism with each other and are at a low level.

The above and other objects, features and advantages of the present invention will be apparent from the following description of preferred embodiments of the invention with reference to the accompanying drawings.

DESCRIPTION OF THE PREFERRED EMBODIMENTS

Figure 1:
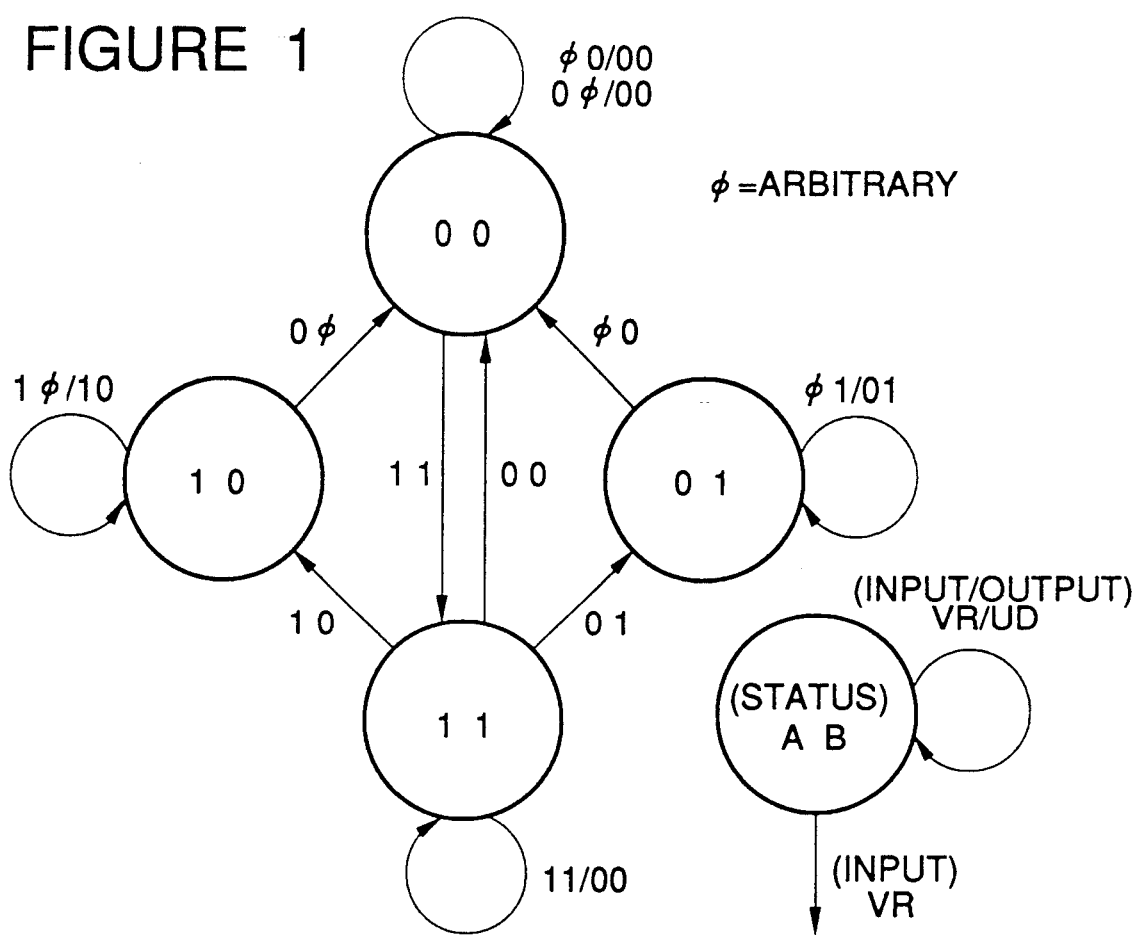
FIG. 1 is a status transition diagram illustrating a principle of the digital phase detector in accordance with the present invention.

Referring to FIG. 1, there is shown a status transition diagram illustrating a principle of the digital phase detector in accordance with the present invention. In FIG. 1, two binary numbers A and B in each of four relatively large circles show four different status, respectively. Two binary numbers given to a straight arrow extending from one status circle to anther status circle indicates a pair of input signals V and R, and a direction of the arrow shows a direction of transition. In addition, each of arched arrows means tha tthe status does not change when two input binary numbers V and R recited at the left side of the slash of the associated slashed numbers are given to the inputs. Two binary numbers recited at the right side of the slash of the associated slashed numbers shows outputs U and D. In addition, φ means an arbitrary binary number.

As seen from FIG. 1, when the input V and the input R are "0" and "0", respectively, the status is "0, 0" without exception, and the outputs U and D are also "0" and "0". Namely, neither the UP signal nor the DOWN signal are generated.

Figure 2:
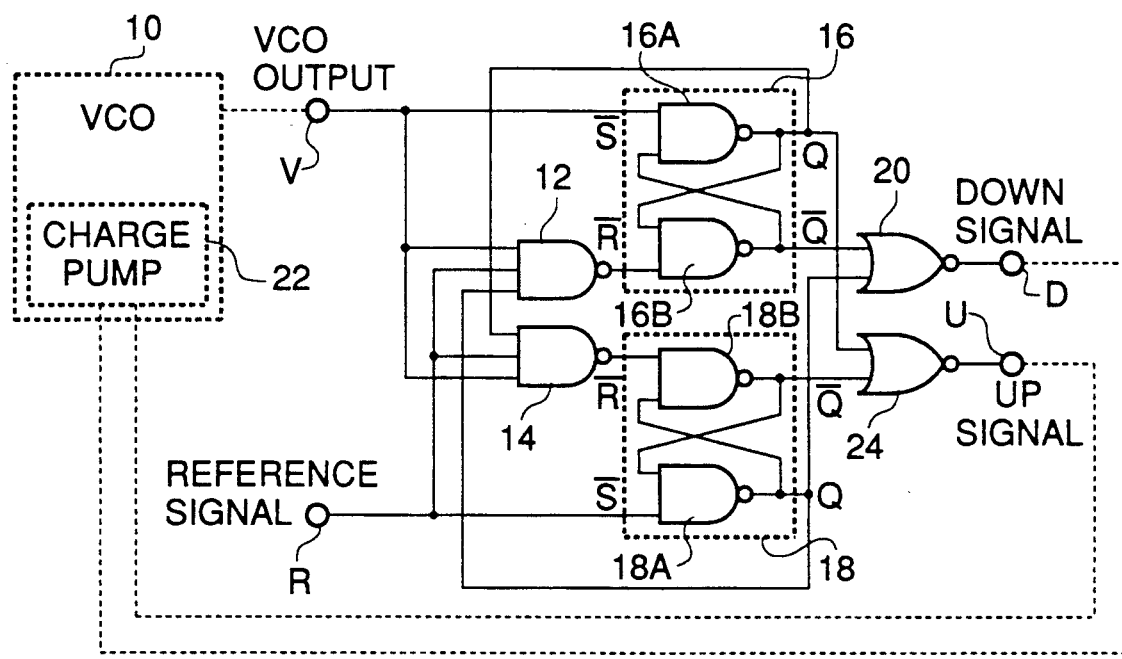
FIG. 2 is a block diagram of one digital phase detector designed in accordance with the status transition diagram shown in FIG. 1.

Referring to FIG. 2, there is shown a clock diagram of one digital phase detector designed in accordance with the status transition diagram shown in FIG. 1. The shown digital phase detector includes a first input V for receiving an output of a voltage control oscillator (VCO) 10, and a second input R for receiving a reference signal, for example, a timing signal derived from a received signal. The first input V and the second input R are connected to first and second inputs of each of a pair of three-input NAND gates 12 and 14. In addition, the first input V and an output of the NAND gate 12 are connected to a set input $\bar{S}$ and a reset input $\bar{R}$ of a RS flipflop 16, respectively. A Q output of the flipflop 16 is connected to a third input of the NAND gate 14. On the other hand, the second input R and an output of the NAND gate 14 are connected to a set input $\bar{S}$ and a reset input $\bar{R}$ of a RS flipflop 18, respectively. A Q output of the flipflop 18 is connected to a third input of the NAND gate 12. A $\bar{Q}$ output of the flipflop 16 and the Q output of the flipflop 18 are connected to a NOR circuit 20, which outputs a DOWN signal D to a charge pump 24. A $\bar{Q}$ output of the flipflop 18 and the Q output of the flipflop 16 are connected to another NOR circuit 24, which outputs an UP signal U to the charge pump 24.

In the shown embodiment, each of the RS-flipflops 16 and 18 is constituted of a pair of two-input NAND gates. Namely, the RS-flipflop 16 incldues a pair of NAND gates 16A and 16B. The NAND gate 16A has a first input connected to the first input, V, a second input connected to an output of the NAND gate 16B, and an output connected to the NOR gate 24. The NAND gate 16B has a first input connected to the output of the NAND gate 12, a second input connected to the output of the NAND gate 16A, and an output connected to the NOR gate 20. On the other hand, the RS-flipflop 18 includes a pair of NAND gates 18A and 18B. The NAND gate 18A has a first input connected to the second input R, a second input connected to an output of the NAND gate 18B, and an output connected to the NOR gate 20. The NAND gate 18B has a first input connected to the output of the NAND gate 14, a second input connected to the output of the NAND gate 18A, and an output connected to the NOR gate 24.

Since the circuit shown in FIG. 2 is designed to realize the status transition process shown in FIG. 1, a detailed description of the operation of the circuit shown in FIG. 2 will be omitted here. Instead of making a detailed description of the operation of the circuit shown in FIG. 2, timing charts for illustrating the operation of the circuit shown in FIG. 2 will be shown in FIGS. 3A to 3D.

Figure 3A:
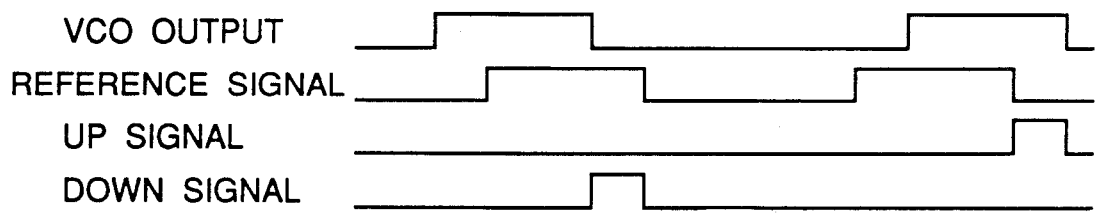
FIGS. 3A to 3D are timing charts illustrating an operation of the digital phase detector shown in FIG. 2.
Figure 3B:
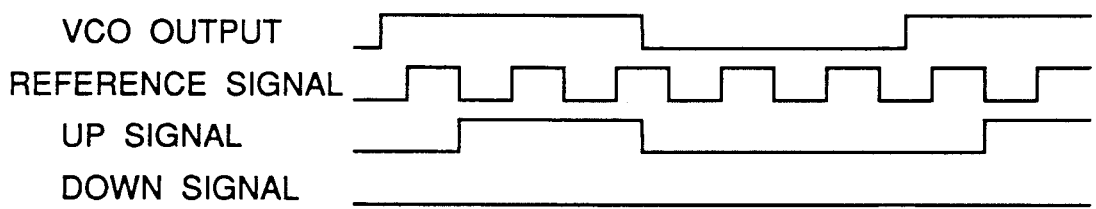
Figure 3C:
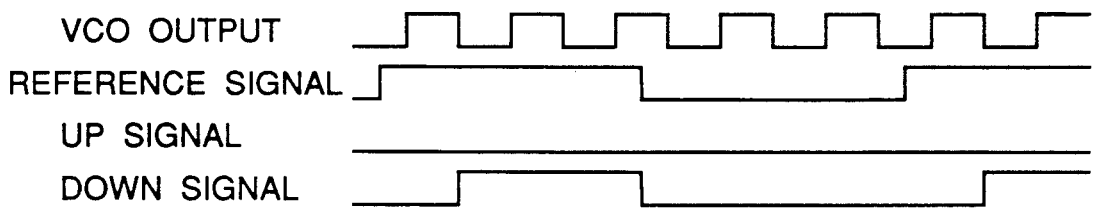

As seen from FIG. 3A, when a phase of the first input or the VCO output V is in advance of that of the second input or the reference signal R, the DOWN signal D is generated, and when the phase of the VCO output V is delayed from that of the reference signal R, the UP signal U is generated. When the frequency of the VCO output V is lower than that of the reference signal R, the UP signal U is generated, as shown in FIG. 3B. When the frequency of the VCO output V is higher than that of the reference signal R, the DOWN signal D is generated, as shown in FIG. 3C.

Figure 3D:
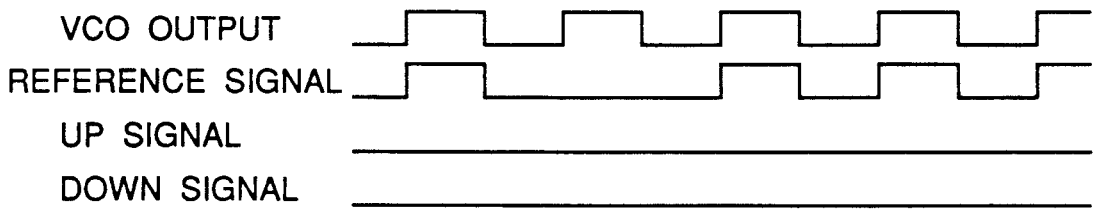

In addition, as shown in FIG. 3D, when the VCO output V is consistent in phase with the reference signal R but different in frequency from the reference signal R, or when the phase and the frequency of the VCO output V are completely in synchronism with those of the reference signal R, neither the UP signal U nor the DOWN signal D is generated.

As seen from the above, the digital phase detector shown in FIG. 2 is advantageous over the conventional one in that even if the reference input R is in the form of a bit train composed of "1" s and "0" s at random, the synchronization can be obtained, without being broken when the two inputs are in synchronism with each other. This would be easily understood from FIG. 3D. Therefore, the digital phase detector shown in FIG. 2 can be effectively incorporated in a phase locked loop for regenerating a timing signal from a received signal in the field of telecommunication.

Furthermore, the digital phase detector shown in FIG. 2 is advantageous over the conventional one in that it can be constructed of a circuit which is very simple as compared with the conventional comparator. This would be clear from comparison between FIG. 2 and FIG. 3.14 on page 49 of the Japanese publication referred to hereinbefore.

Figure 4:
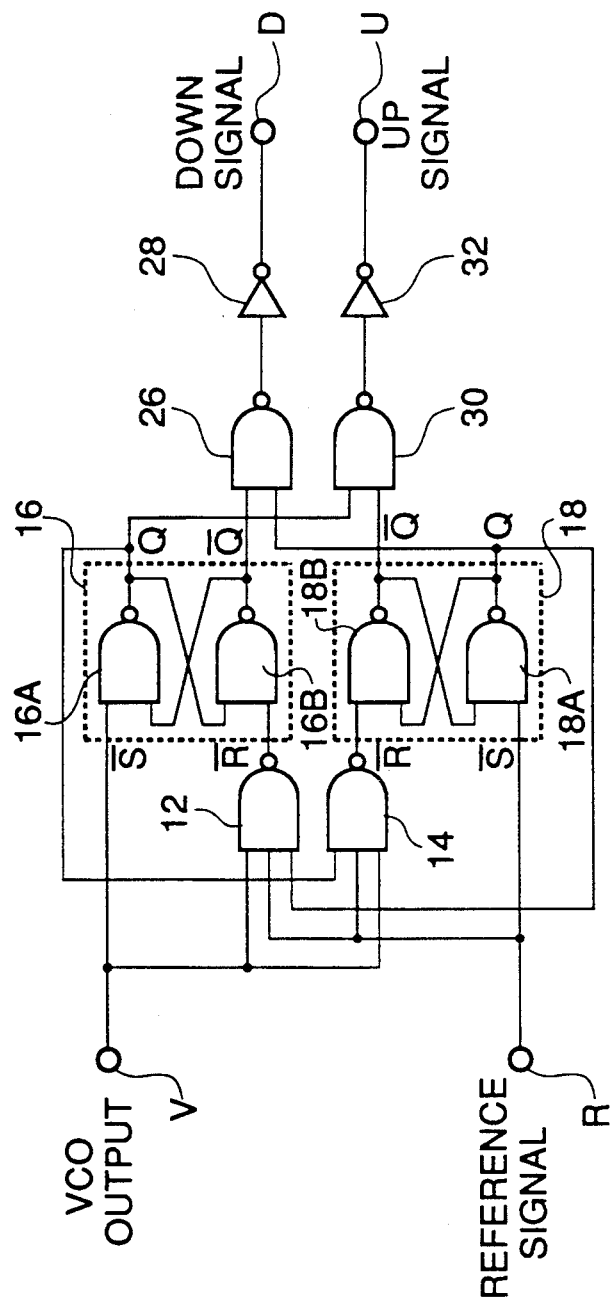
FIG. 4 is a block diagram showing a modification of the digital phase detector shown in FIG. 2.

The status transition diagram can be realized not only by the logic circuit shown in FIG. 2, but also by other logic circuits. For example, the status transition diagram can be realized by a circuit shown in FIG. 4. The circuit shown in FIG. 4 is a modification of the circuit shown in FIG. 2. Therefore, elements similar or corresponding to those shown in FIG. 2 are given the same Reference Numerals, and explanation thereof will be omitted. As seen from comparison between FIGS. 2 and 4, the circuit shown in FIG. 4 comprises and NAND gate 26 and a series-connected inverter 28, in place of the NOR gate 20, and another NAND gate 30 and a series-connected inverter 32, in place of the NOR gate 24.

In any case, the circuit shown in FIG. 2 can be said to be the simplest digital phase detector for attaining the status transition shown in FIG. 1. However, it would be apparent to persons skilled in the art that the status transition shown in FIG. 1 can be realized through more complicated various status transition processes, namely, by more complicated various logic circuits.

In addition, the circuit shown in FIG. 2 has been such that the output of the voltage controlled oscillator is directly connected to the terminal V. However, it would be apparent to averaged persons skilled in the art that the output of the voltage controlled oscillator is connected through a frequency divider to the terminal V.

The invention has thus been shown and described with reference to the specific embodiments. However, it should be noted that the present invention is in no way limited to the details of the illustrated structures but changes and modifications may be made within the scope of the appended claims.

I claim:

1. A digital phase detector comprising a first input for receiving an output of a voltage controlled oscillator and a second input for receiving a reference signal, the phase detector operating to compare said first input with said second input both in phase and in frequency so as to output a first control signal for decrease of an oscillation frequency of the voltage controlled oscillatior when a phase of said first input is in advance of that of said second input or when a frequency of said first input is higher than that of said second input, and so as to output a second control signal for increase of the oscillation frequency of the voltage controlled oscillator when the phase of said first input is delayed from that of said second input or when the frequency of said first input is lower than that of said second input, the phase detector being configured to output neither said first control signal nor said second control signal when both of said first input and said second input are at a low level;

said digital phase detector further including:

first and second three-input NAND gates each having a first input connected to receive said output of the voltage controlled oscillator and a second input connected to receive said reference signal;

a first RS-flipflop having a set input connected to receive said output of the voltage controlled oscillator, a reset input connected to an output of said first NAND gate, and a Q output connected to a third input of said second NAND gate;

a second RS-flipflop having a set input connected to receive said reference signal, a reset input connected to an output of said second NAND gate, and a Q output connected to a third input of said first NAND gate;

a first logic output circuit having a first input connected to a $\overline{Q}$ output of said first flipflop, a second input connected to the Q output of said second flipflop, and an output for generating said first control signal for decrease of the oscillaiton frequency of the voltage controlled oscillator; and a second logic output circuit having a first input connected to a Q output of said second flipflop, a second input connected to the Q output of said first flipflop, and an output for generating said second control signal for increase of the oscillation frequency of the voltage controlled oscillator.

2. A digital phase detector claimed in claim 1 wherein said first logic output circuit is composed of a first NOR gate having a first input connected to the $\overline{Q}$ output of said first flipflop, a second input connected to the Q output of said second flipflop, and an output for generating said first control signal for decrease of the oscillation frequency of the voltage controlled oscillator; and wherein said second logic output circuit is composed of a second NOR gate having a first input connected to the $\overline{Q}$ output of said second flipflop, a second input connected to the Q output of said first flipflop, and an output for generating said second control signal for increase of the oscillation frequency of the voltage controlled oscillator.

3. A digital phase detector claimed in claim 1 wherein said first logic output circuit is composed of a first two-input NAND gate having a first input connected to the $\overline{Q}$ output of said first flipflop and a second input connected to the Q output of said second flipflop, and a first inverter having an input connected to an output of said first two-input NAND gate and an output for generating said first control signal for decrease of the oscillation frequency of the voltage controlled oscillator; and wherein said second logic output circuit is composed of a second two-input NAND gate having a first input connected to the $\overline{Q}$ output of said second flipflop and a second input connected to the Q output of said first flipflop, and a second inverter having an input connected to an output of said second two-input NAND gate and an output for generating said second control signal for increase of the oscillation frequency of the voltage controlled oscillator.

4. A digital phase detector comprising:

a first input for receiving an output of a voltage controlled oscillator;

a second input for receiving a reference signal;

first and second three-input NAND gates each having a first input connected to receive said output of the voltage controlled oscillator and a second input connected to receive said reference signal;

a first RS-flipflop having a set input connected to receive said output of the voltage controlled oscillator, a reset input connected to an output of said first NAND gate, and a Q output connected to a third input of said second NAND gate;

a second RS-flipflop having a set input connected to receive said reference signal, a reset input connected to an output of said second NAND gate, and a Q output connected to a third input of said first NAND gate;

a first logic output circuit having a first input connected to a $\overline{Q}$ output of said first flipflop, a second input connected to the Q output of said second flipflop, and an output for generating a DOWN signal for decrease of the oscillation frequency of the voltage controlled oscillator; and a second logic output circuit having a first input connected to a $\overline{Q}$ output of said second flipflop, a second input connected to the Q output of said first flipflop, and an output for generating an UP signal for increase of the oscillation frequency of the voltage controlled oscillator.

* * * * *

UNITED STATES PATENT AND TRADEMARK OFFICE
CERTIFICATE OF CORRECTION

PATENT NO. : 5,059,833

DATED : October 22, 1991

INVENTOR(S) : Takashi FUJII

It is certified that error appears in the above-identified patent and that said Letters Patent is hereby corrected as shown below:

Col. 2, line 33, delete "thrid" and insert --third--;

Col. 3, line 18, delete "anther" and insert --another--;

Col. 3, line 21, delete "tha tthe" and insert -- that the--;

Col. 3, line 44, delete "Sand" and insert --S and--;

Col. 5, line 60, delete "oscillaition" and insert --oscillation--;

Col. 6, line 5, delete "Qoutput" and insert --Q output--;

Col. 6, line 20, delete "Qoutput" and insert --Q output--.

Signed and Sealed this

Thirteenth Day of April, 1993

*Attest:*

STEPHEN G. KUNIN

*Attesting Officer*    Acting Commissioner of Patents and Trademarks